(12) United States Patent
Kimura et al.

(10) Patent No.: US 8,587,372 B2
(45) Date of Patent: Nov. 19, 2013

(54) MULTI-INPUT DIFFERENTIAL AMPLIFIER AND LIGHT EMITTING ELEMENT DRIVING DEVICE

(75) Inventors: Kazuhito Kimura, Kyoto (JP); Yasunori Yamamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 265 days.

(21) Appl. No.: 13/149,218

(22) Filed: May 31, 2011

(65) Prior Publication Data

US 2011/0291589 A1 Dec. 1, 2011

(30) Foreign Application Priority Data

May 31, 2010 (JP) ................... 2010-124902

(51) Int. Cl.
*H03F 9/00* (2006.01)
*H03L 5/00* (2006.01)
*G05F 1/00* (2006.01)

(52) U.S. Cl.
USPC ............... 330/9; 327/539; 327/306; 327/513; 327/124; 327/307; 330/251; 330/254; 315/291; 315/294

(58) Field of Classification Search
USPC ............... 330/9, 252, 261, 278, 260, 98, 254, 330/283, 86, 69, 288; 327/306, 538, 539, 327/513, 515, 170, 351, 352, 362; 315/294, 315/291, 307, 308
See application file for complete search history.

(56) References Cited

U.S. PATENT DOCUMENTS

| | | | |
|---|---|---|---|
| 6,489,845 B1 | 12/2002 | Maschhoff | |
| 6,690,146 B2 | 2/2004 | Burgyan et al. | |
| 7,292,094 B2 * | 11/2007 | Kwon | 330/9 |
| 7,724,219 B2 | 5/2010 | Ikeda | |
| 8,125,364 B2 * | 2/2012 | Torii | 341/151 |
| 2004/0145957 A1 | 7/2004 | Perner | |
| 2004/0208011 A1 | 10/2004 | Horiuchi et al. | |

FOREIGN PATENT DOCUMENTS

| | | |
|---|---|---|
| JP | 2003-332624 | 11/2003 |
| JP | 2004-020867 | 1/2004 |
| JP | 2004-200867 | 7/2004 |
| JP | 4031447 | 10/2007 |

* cited by examiner

*Primary Examiner* — Vibol Tan
(74) *Attorney, Agent, or Firm* — McDermott Will & Emery LLP

(57) ABSTRACT

A multi-input differential amplifying device of the present invention includes: a differential amplifier having an inverting input terminal and a non-inverting input terminal; and an input portion configured to apply a first input voltage to a first input terminal that is one of the inverting input terminal and the non-inverting input terminal and apply a second input voltage to a second input terminal that is the other input terminal, the first input voltage corresponding to first input signals that are a plurality of input signals for the first input terminal, the second input voltage corresponding to a second input signal that is one input signal for the second input terminal. The input portion is configured to correct an offset voltage between the first input voltage and the second input voltage.

12 Claims, 3 Drawing Sheets

MULTI-INPUT DIFFERENTIAL AMPLIFIER AND LIGHT EMITTING ELEMENT DRIVING DEVICE

The disclosure of Japanese Patent Application No. 2010-124902 filed on May 31, 2010 including a specification, drawings and claims is incorporated herein by reference in its entirety.

BACKGROUND OF THE INVENTION

1. Field of the Invention

The present invention relates to a multi-input differential amplifier configured to amplify a difference between multiple inputs and a light emitting element driving device using the multi-input differential amplifier.

2. Description of the Related Art

In a common differential amplifier, one input signal is input to an inverting input terminal thereof, and another input signal is input to a non-inverting input terminal thereof. In such common differential amplifier, it is known that an input offset is canceled by controlling a potential of a back gate of a field-effect transistor constituting the differential amplifier (see Japanese Patent No. 4031447 and Japanese Laid-Open Patent Application Publication No. 2004-200867, for example).

FIG. 6 is a diagram showing the configuration of a differential amplifier shown in FIG. 4 of Japanese Patent No. 4031447. As shown in FIG. 6, this conventional differential amplifier detects an offset amount and controls the potential of the back gate of the field-effect transistor constituting the differential amplifier, thereby cancelling the detected offset.

Meanwhile, for example, FIG. 2 of Japanese Laid-Open Patent Application Publication No. 2003-332624 discloses a selection circuit which is configured as a differential amplifier in its entirety and to which a plurality of inverting input voltage signals are input and an output voltage of the differential amplifier is input as a non-inverting input voltage signal. In accordance with this configuration of Japanese Laid-Open Patent Application Publication No. 2003-332624, a signal having a lowest voltage is selected from the plurality of inverting input voltage signals and is output through a voltage follower.

SUMMARY OF INVENTION

Here, in a differential amplifying device, there is a case where: one of the number of inverting input signals and the number of non-inverting input signals is plural; one of the plurality of input signals is preferably selected; and a difference between the selected signal and the other one of the inverting input signal and the non-inverting input signal is amplified. In this case, it is necessary to amplify the difference between the inverting input signal and the non-inverting input signal without generating an offset voltage.

However, since the differential amplifier described in each of Japanese Patent No. 4031447 and Japanese Laid-Open Patent Application Publication No. 2004-200867 is a one-input differential amplifier, it cannot receive, select, or amplify a plurality of input signals.

In addition, the selection circuit described in Japanese Laid-Open Patent Application Publication No. 2003-332624 just selects one of a plurality of inverting input voltage signals and cannot amplify the difference between the selected signal and the non-inverting input signal externally input.

The present invention was made to solve such problems, and an object of the present invention is to provide a multi-input differential amplifying device configured to, when one of the number of inverting input signals and the number of non-inverting input signals is plural, select one of the plurality of input signals and amplify the difference between the selected signal and the other one of the inverting input signal and the non-inverting input signal.

To achieve the above object, a multi-input differential amplifying device according to one aspect of the present invention includes: a differential amplifier including an inverting input terminal and a non-inverting input terminal; and an input portion configured to apply a first input voltage to one (hereinafter referred to as a "first input terminal") of the inverting input terminal and the non-inverting input terminal and apply a second input voltage to the other input terminal (hereinafter referred to as a "second input terminal"), the first input voltage corresponding to a plurality of input signals (hereinafter referred to as "first input signals") for the first input terminal, the second input voltage corresponding to one input signal (hereinafter referred to as a "second input signal") for the second input terminal, wherein the input portion is configured to correct an offset voltage between the first input voltage and the second input voltage.

The input portion may include a plurality of input circuits corresponding to the plurality of first input signals, and each of the input circuits may include: a first field-effect transistor having a source connected to the first input terminal and a gate to which a corresponding one of the first input signals is input; a second field-effect transistor having a source connected to the second input terminal and a gate to which the second input signal is input; and a back gate potential control circuit configured to generate a control voltage corresponding to a drain current of the first field-effect transistor and apply the generated control voltage to a back gate of the first field-effect transistor and a back gate of the second field-effect transistor.

The back gate potential control circuit may be configured to generate such a control voltage that: if the drain current of the first field-effect transistor increases, an impedance between a drain and the source of each of the first field-effect transistor and the second field-effect transistor decreases; and if the drain current of the first field-effect transistor decreases, the impedance between the drain and the source of each of the first field-effect transistor and the second field-effect transistor increases.

The first field-effect transistor and the second field-effect transistor may be P-channel field-effect transistors.

The first field-effect transistor and the second field-effect transistor may be N-channel field-effect transistors.

A light emitting element driving device according to another aspect of the present invention includes: a power supply portion configured to apply a power supply voltage to a plurality of current paths, on each of which a plurality of light emitting elements and a driver configured to supply a current to the plurality of light emitting elements are connected in series; the above-described multi-input differential amplifying device including (i) the input portion to which voltages applied to the drivers on the plurality of current paths are input as the plurality of first input signals and a reference voltage is input as the second input signal and (ii) the differential amplifier configured to amplify a difference between the reference voltage and one of the voltages applied to the drivers on the plurality of current paths to output the difference; and a control portion configured to carry out feedback control of a power supply voltage applied by the power supply based on an output of the differential amplifier of the multi-input differential amplifying device.

The aspect of the present invention has an effect of, when one of the number of inverting input signals and the number of non-inverting input signals is plural, selecting one of the plurality of input signals and amplifying the difference between the selected signal and the other one of the inverting input signal and the non-inverting input signal.

The above object, other objects, features and advantages of the present invention will be made clear by the following detailed explanation of preferred embodiments with reference to the attached drawings.

DESCRIPTION OF THE PREFERRED EMBODIMENTS

Figure 1:
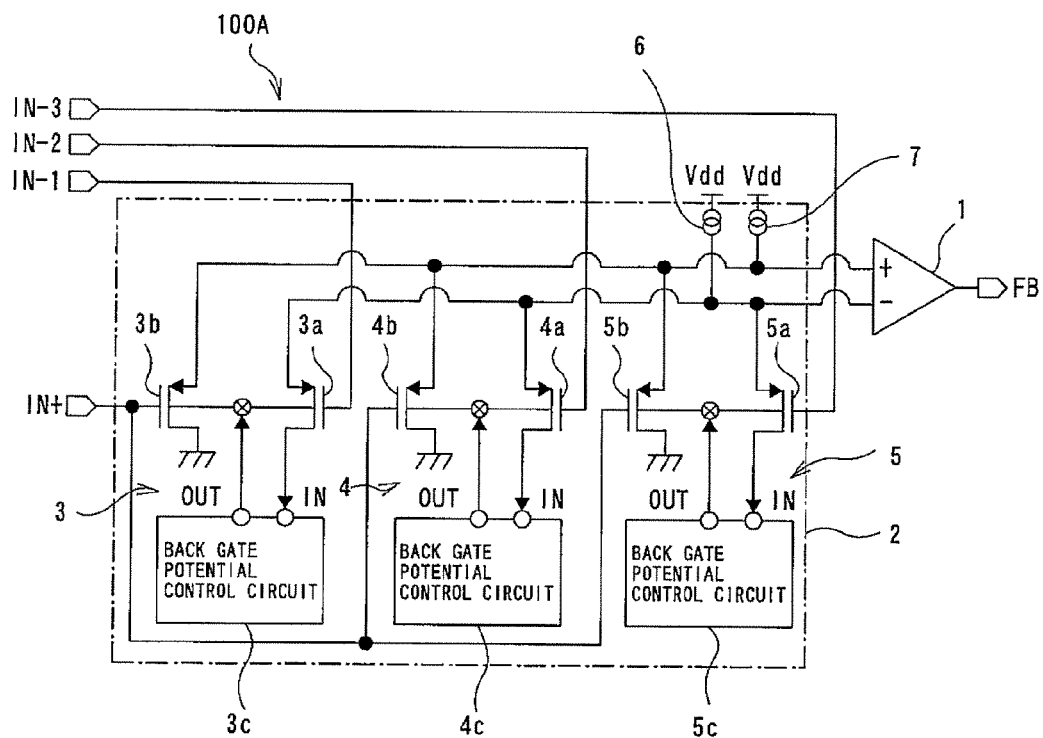
FIG. 1 is a circuit diagram showing the configuration of a multi-input differential amplifier according to Embodiment 1 of the present invention.

Hereinafter, embodiments of the present invention will be explained in reference to the drawings. In the drawings, the same reference signs are used for the same or corresponding components, and a repetition of the same explanation is avoided.

Embodiment 1

FIG. 1 is a circuit diagram showing the configuration of a multi-input differential amplifier according to Embodiment 1 of the present invention.

As shown in FIG. 1, a multi-input differential amplifier 100A of Embodiment 1 includes a differential amplifier 1 and an input portion 2.

A known differential amplifier can be used as the differential amplifier 1. Here, the "differential amplifier" may be a differential amplifier having a predetermined amplification factor or an operational amplifier having a practically infinite amplification factor.

As a characteristic function of the present invention, the input portion 2 has a function of: selecting a pair of one of a plurality of input signals (signals input to one (first input terminal) of an inverting input terminal and a non-inverting input terminal of the differential amplifier 1 after selected and amplified; first input signals) for the first input terminal and one input signal (signal input to the other one (second input terminal) of the inverting input terminal and the non-inverting input terminal of the differential amplifier 1 after amplified; second input signal) for the second input terminal; and respectively inputting these two signals to the corresponding input terminals of the differential amplifier 1.

Specifically, a plurality of (herein, three) inverting input signals IN-1 to IN-3 are input to the input portion 2 as the first input signals. The input portion 2 includes a plurality of (herein, three) input circuits 3 to 5 corresponding to the plurality of inverting input signals IN-1 to IN-3.

Each of the input circuits 3 to 5 includes: a first field-effect transistor (3a, 4a, 5a) as an inverting input signal amplifying element; a second field-effect transistor (3b, 4b, 5b) as a non-inverting input signal amplifying element; and a back gate potential control circuit (3c, 4c, 5c). Herein, each of the first field-effect transistors 3a, 4a, and 5a and second field-effect transistors 3b, 4b, and 5b of the input circuits 3 to 5 is constituted by a P-channel field-effect transistor (such as a P-channel MOSFET). It is preferable that the first field-effect transistors 3a, 4a, and 5a and the second field-effect transistors 3b, 4b, and 5b be constituted by field-effect transistors which are practically the same in size as one another.

Sources of the first field-effect transistors 3a, 4a, and 5a of the input circuits 3 to 5 are connected to the inverting input terminal of the differential amplifier 1 and a first current source 6. Herein, the first current source 6 is connected to a positive supply Vdd and supplies a constant current. Moreover, each of drains of the first field-effect transistors 3a, 4a, and 5a of the input circuits 3 to 5 is connected to a ground terminal via a current-voltage conversion element 21 (see FIG. 2) of the below-described back gate potential control circuit (3c, 4c, 5c). Then, the inverting input signals IN-1 to IN-3 are respectively input to gates of the first field-effect transistors 3a, 4a, and 5a of the corresponding input circuits 3 to 5.

Meanwhile, sources of the second field-effect transistors 3b, 4b, and 5b of the input circuits 3 to 5 are connected to the non-inverting input terminal of the differential amplifier 1 and a second current source 7. Herein, the second current source 7 is connected to the positive supply Vdd and supplies a constant current. Moreover, each of drains of the second field-effect transistors 3b, 4b, and 5b of the input circuits 3 to 5 is connected to the ground terminal (grounded). Then, one non-inverting input signal IN+ is input to each of gates of the second field-effect transistors 3b, 4b, and 5b of the input circuits 3 to 5.

Each of the back gate potential control circuits 3c, 4c, and 5c is configured to generate a control voltage corresponding to a drain current of the first field-effect transistor (3a, 4a, 5a) of the corresponding input circuit (3, 4, 5) and apply the generated control voltage to a back gate of the first field-effect transistor (3a, 4a, 5a) of the corresponding input circuit (3, 4, 5) and a back gate of the second field-effect transistor (3b, 4b, 5b) of the corresponding input circuit (3, 4, 5). Specifically, each of the back gate potential control circuits 3c, 4c, and 5c is configured to generate such a control voltage that: when the drain current of the first field-effect transistor (3a, 4a, 5a) increases, an impedance (practically, resistance: hereinafter referred to as an "internal impedance") between the drain and source of each of the first field-effect transistors 3a, 4a, and 5a and the second field-effect transistors 3b, 4b, and 5b decreases; and when the drain current of the first field-effect transistor (3a, 4a, 5a) decreases, the internal impedance of each of the first field-effect transistors 3a, 4a, and 5a and the second field-effect transistors 3b, 4b, and 5b increases.

Figure 2:
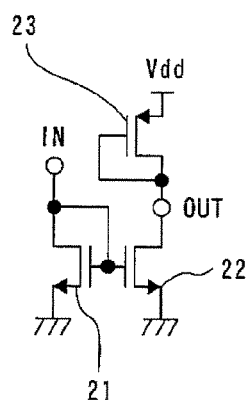
FIG. 2 is a circuit diagram showing a configuration example of a back gate potential control circuit in the multi-input differential amplifier of FIG. 1.

FIG. 2 is a circuit diagram showing a configuration example of the back gate potential control circuit in the multi-input differential amplifier of FIG. 1.

As shown in FIG. 2, each of the back gate potential control circuits 3c, 4c, and 5c includes the current-voltage conversion element 21 connected to the drain of the first field-effect transistor (3a, 4a, 5a) of the corresponding input circuit (3, 4, 5). For example, the current-voltage conversion element 21 is constituted by a diode-connected N-channel field-effect transistor (such as an N-channel MOSFET). A drain of the current-voltage conversion element 21 is connected to the drain of the first field-effect transistor (3a, 4a, 5a) of the corresponding input circuit (3, 4, 5) (a connection point is shown by IN in FIG. 2), and a source of the current-voltage conversion element 21 is connected to the ground terminal. Moreover, a gate of the current-voltage conversion element 21 is connected to the drain thereof and a gate of a voltage-current conversion element 22. For example, the voltage-current conversion element 22 is constituted by an N-channel field-effect transistor (such as an N-channel MOSFET). It is preferable that the current-voltage conversion element 21 and the voltage-current conversion element 22 be constituted by field-effect transistors which are practically the same in size as each other. A source of the voltage-current conversion element 22 is connected to the ground terminal, and a drain of the voltage-current conversion element 22 is connected to the positive supply Vdd via a current-voltage conversion element 23. For example, the current-voltage conversion element 23 is constituted by a diode-connected P-channel field-effect transistor (such as a P-channel MOSFET). A drain of the current-voltage conversion element 23 is connected to a gate thereof and the drain of the voltage-current conversion element 22, and a source of the current-voltage conversion element 23 is connected to the positive supply Vdd. Then, a voltage of a connection point OUT where the drain of the voltage-current conversion element 22 and the drain of the current-voltage conversion element 23 are connected to each other is applied as the control voltage to the back gate of the first field-effect transistor (3a, 4a, 5a) of the corresponding input circuit (3 to 5) and the back gate of the second field-effect transistor (3b, 4b, 5b) of the corresponding input circuit (3 to 5) (see FIG. 1). The current-voltage conversion element 23 may be constituted by a resistive element.

In summary, the first field-effect transistors 3a, 4a, and 5a for amplifying the inverting input signals in the plurality of (herein, three) input circuits 3 to 5 are arranged between the first current source 6 connected to the positive supply Vdd and the ground terminal so as to be connected to one another in parallel. Then, a connection point where the first current source 6 and the sources of the first field-effect transistors 3a, 4a, and 5a are connected to one another is connected to the inverting input terminal of the differential amplifier 1. Moreover, the second field-effect transistors 3b, 4b, and 5b for amplifying the non-inverting input signal in the plurality of input circuits 3 to 5 are arranged between the second current source 7 connected to the positive supply Vdd and the ground terminal so as to be connected to one another in parallel. Then, a connection point where the second current source 7 and the sources of the second field-effect transistors 3b, 4b, and 5b are connected to one another is connected to the non-inverting input terminal of the differential amplifier 1. Then, in each of the input circuits 3 to 5, the corresponding inverting input signal (IN-1, IN-2, IN-3) is input to the gate of the first field-effect transistor (3a, 4a, 5a), and one non-inverting input signal IN+ is input to the gate of the second field-effect transistor (3b, 4b, 5b). Moreover, in each of the input circuits 3 to 5, the control voltage corresponding to the drain current of the first field-effect transistor (3a, 4a, 5a) is applied from the corresponding back gate potential control circuit (3c, 4c, 5c) to the back gate of the first field-effect transistor (3a, 4a, 5a) and the back gate of the second field-effect transistor (3b, 4b, 5b).

Operations

Next, the operations of the multi-input differential amplifier configured as above will be explained.

In FIGS. 1 and 2, when the plurality of inverting input signals IN-1 to IN-3 and one non-inverting input signal IN+ are input, in each of the input circuits 3 to 5, the drain current corresponding to the corresponding inverting input signal (IN-1, IN-2, IN-3) flows through the first field-effect transistor (3a, 4a, 5a), and the drain current corresponding to the non-inverting input signal IN+ flows through the second field-effect transistor (3b, 4b, 5b). More specifically, in each of the input circuits 3 to 5, the internal impedance of the first field-effect transistor (3a, 4a, 5a) becomes an impedance corresponding to the corresponding inverting input signal (IN-1, IN-2, IN-3), and the internal impedance of the second field-effect transistor (3b, 4b, 5b) becomes an impedance corresponding to the non-inverting input signal IN+. With this, the constant current supplied from the first current source 6 is divided in inverse proportion to the internal impedances of the first field-effect transistors 3a, 4a, and 5a to flow through the first field-effect transistors 3a, 4a, and 5a. As a result, the drain currents corresponding to the inverting input signals IN-1, IN-2, and IN-3 respectively flow through the first field-effect transistors 3a, 4a, and 5a. In this case, the highest is the drain current of the first field-effect transistor (3a, 4a, 5a) having the gate to which the inverting input signal (IN-1, IN-2, IN-3) having the lowest (smallest) voltage value among the inverting input signals IN-1 to IN-3 is input. Moreover, the constant current supplied from the second current source 7 is divided in inverse proportion to the internal impedances of the second field-effect transistors 3b, 4b, and 5b to flow through the second field-effect transistors 3b, 4b, and 5b. As a result, the drain current corresponding to the non-inverting input signal IN+ flows through each of the second field-effect transistors 3b, 4b, and 5b. In this case, the magnitudes of the drain currents of the second field-effect transistors 3b, 4b, and 5b are practically the same as one another.

The plurality of first field-effect transistors 3a, 4a, and 5a are connected to one another in parallel. Therefore, a voltage corresponding to the product of the internal impedance and drain current of the first field-effect transistor (3a, 4a, 5a) is generated at the connection point where the first current source 6 and the sources of the first field-effect transistors 3a, 4a, and 5a are connected to one another, and this voltage is common among the plurality of first field-effect transistors 3a, 4a, and 5a. This voltage is applied to the inverting input terminal of the differential amplifier 1. With this, the inverting input signals IN-1 to IN-3 are respectively selected by the plurality of first field-effect transistors 3a, 4a and 5a and collectively applied to the inverting input terminal of the differential amplifier 1.

Moreover, the plurality of second field-effect transistors 3b, 4b, and 5b are connected to one another in parallel. Therefore, a voltage (voltage obtained by amplifying the non-inverting input signal) corresponding to the product of the internal impedance and drain current of the second field-effect transistor (3b, 4b, 5b) is generated at the connection point where the second current source 7 and the sources of the second field-effect transistors 3b, 4b, and 5b are connected to one another, and this voltage is common among the plurality of second field-effect transistors 3b, 4b, and 5b. This voltage is applied to the non-inverting input terminal of the differential amplifier 1. With this, one non-inverting input signal IN+ is selected by each of the plurality of second field-effect transistors 3b, 4b, and 5b and collectively applied to the non-inverting input terminal of the differential amplifier 1.

Meanwhile, in each of the back gate potential control circuits 3c, 4c, and 5c of the input circuits 3 to 5, a voltage corresponding to the drain current of the corresponding first field-effect transistor (3a, 4a, 5a) is generated at both ends of the current-voltage conversion element 21. This voltage is applied to the gate of the voltage-current conversion element 22. With this, a drain current corresponding to this voltage flows through the voltage-current conversion element 22, and a voltage corresponding to this drain current is generated at both ends of the current-voltage conversion element 23. With this, a voltage which decreases as the drain current of the corresponding first field-effect transistor (3a, 4a, 5a) increases is generated at the connection point OUT where the voltage-current conversion element 22 and the current-voltage conversion element 23 are connected to each other. The voltage of the connection point OUT is applied as a control voltage to the back gate of the corresponding first field-effect transistor (3a, 4a, 5a) and the back gate of the corresponding second field-effect transistor (3b, 4b, 5b).

Then, a threshold voltage of each of the first field-effect transistors 3a, 4a, and 5a and the second field-effect transistors 3b, 4b, and 5b increases (Since the first field-effect transistors 3a, 4a, and 5a are P-channel transistors, the threshold voltage is a negative value. The absolute value of the threshold voltage decreases.), and the internal impedance thereof decreases.

With this, the drain current of the first field-effect transistor (3a, 4a, 5a) having the gate to which the inverting input signal (IN-1, IN-2, IN-3) having the lowest voltage value is input among the plurality of first field-effect transistors 3a, 4a, and 5a increases, and this decreases the drain current of the other first field-effect transistor (3a, 4a, 5a). Then, the change in the drain current in the first field-effect transistor (3a, 4a, 5a) is fed back to the corresponding back gate potential control circuit (3c, 4c, 5c). Thus, the threshold voltage of the first field-effect transistor (3a, 4a, 5a) having the gate to which the inverting input signal (IN-1, IN-2, IN-3) having the lowest voltage value is input increases more, and the drain current thereof increases more. Moreover, the threshold voltage of the other first field-effect transistor (3a, 4a, 5a) decreases more, and the drain current thereof decreases more. Then, finally, most (preferably all) of the current supplied from the first current source 6 flows as the drain current through the first field-effect transistor (3a, 4a, 5a) having the gate to which the inverting input signal (IN-1 to IN-3) having the lowest voltage value is input. A voltage corresponding to the product of the internal impedance and drain current of the first field-effect transistor (3a, 4a, 5a) in this state is applied to the inverting input terminal of the differential amplifier 1.

With this, the inverting input signal (IN-1, IN-2, IN-3) having the lowest voltage value among the plurality of inverting input signal IN-1 to IN-3 is preferentially selected to be applied to the inverting input terminal of the differential amplifier 1.

Meanwhile, when the internal impedance of the second field-effect transistor (3b, 4b, 5b) becomes low, the drain current of the second field-effect transistor (3b, 4b, 5b) of the input circuit (3, 4, 5) including the first field-effect transistor (3a, 4a, 5a) having the gate to which the inverting input signal (IN-1, IN-2, IN-3) having the lowest voltage value is input increases, and this decreases the drain current of the other second field-effect transistor (3b, 4b, 5b). Then, finally, most (preferably all) of the constant current supplied from the second current source 7 flows as the drain current of the second field-effect transistor (3b, 4b, 5b) of the input circuit (3, 4, 5) including the first field-effect transistor (3a, 4a, 5a) having the gate to which the inverting input signal (IN-1, IN-2, IN-3) having the lowest voltage value is input. A voltage corresponding to the product of the internal impedance and drain current of the second field-effect transistor (3b, 4b, 5b) in this state is applied to the non-inverting input terminal of the differential amplifier 1.

With this, the second field-effect transistor (3b, 4b, 5b) of the input circuit (3, 4, 5) corresponding to the inverting input signal (IN-1, IN-2, IN-3) having the lowest voltage value is selected among the plurality of second field-effect transistors 3b, 4b, and 5b. Then, the non-inverting signal IN+ input to the gate of the selected second field-effect transistor (3b, 4b, 5b) is selected by the second field-effect transistor (3b, 4b, 5b) to be applied to the non-inverting input terminal of the differential amplifier 1. In addition, in the same input circuit (3, 4, 5), the same control voltage is applied to the back gate of the first field-effect transistor (3a, 4a, 5a) and the back gate of the second field-effect transistor (3b, 4b, 5b). Therefore, the offset is prevented from being generated between the voltage input to the inverting input terminal of the differential amplifier 1 and the voltage input to the non-inverting input terminal of the differential amplifier 1 by the change in the threshold by the application of the control voltage to the back gates.

Here, since the above explained transient state elapses instantly, a final state actually appears. With this, the differential amplifier 1 amplifies the difference between the inverting input signal (IN-1, IN-2, IN-3) having the lowest voltage value and the non-inverting signal IN+ to output the difference.

As explained above, the multi-input differential amplifier of the present embodiment can select a pair of one input signal (input signal having the lowest voltage value) among the plurality of inverting input signals IN-1 to IN-3 and one non-inverting input signal IN+, and amplify and output the difference between these signals (select the input signals and amplify the difference between the input signals at substantially the same time). In addition, the offset is prevented from being generated when selecting a pair of one of the inverting input signals IN-1 to IN-3 and one non-inverting input signal IN+.

Embodiment 2

Figure 3:
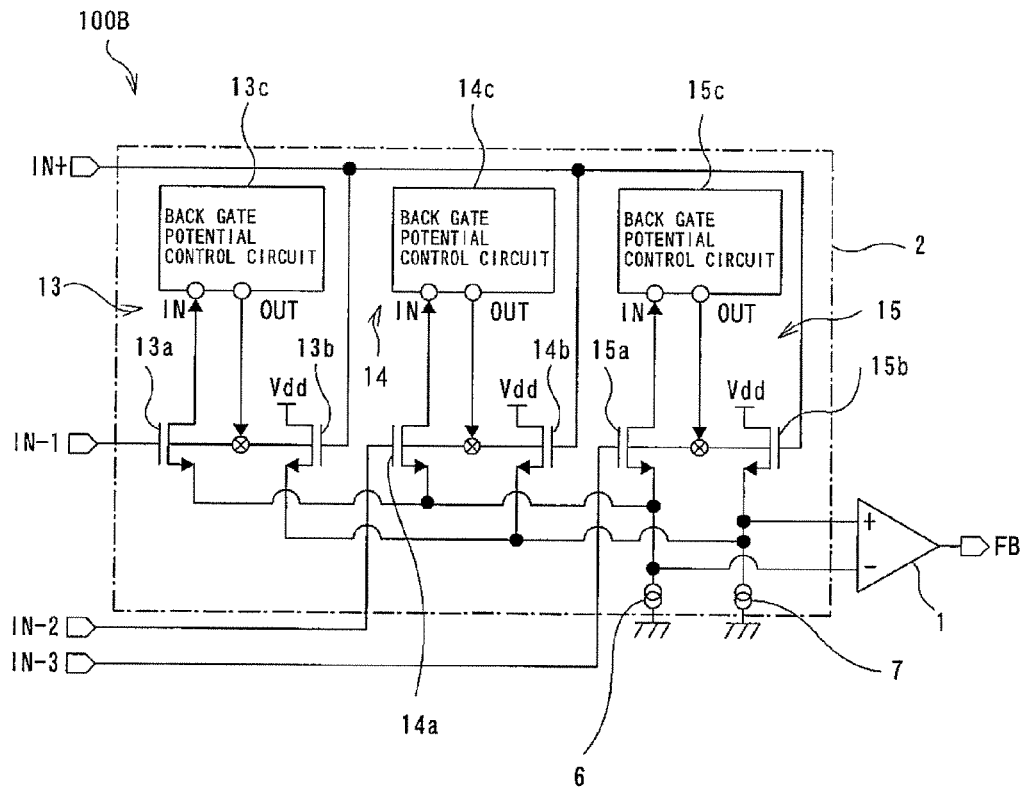
FIG. 3 is a circuit diagram showing the configuration of the multi-input differential amplifier according to Embodiment 2 of the present invention.

FIG. 3 is a circuit diagram showing the configuration of the multi-input differential amplifier according to Embodiment 2 of the present invention.

A multi-input differential amplifier 100B of Embodiment 2 is different from the multi-input differential amplifier 100A of Embodiment 1 in that among the plurality of inverting input signals IN-1 to IN-3, the inverting input signal (IN-1, IN-2, IN-3) having the highest (largest) voltage value is selected. Instead of this, the multi-input differential amplifier 100B of Embodiment 2 is the same as the multi-input differential amplifier 100A of Embodiment 1.

In the input portion 2, each of the input circuits 13 to 15 includes a first field-effect transistor (13a, 14a, 15a) as an inverting input signal selecting element, a second field-effect transistor (13b, 14b, 15b) as a non-inverting input signal selecting element, and a back gate potential control circuit (13c, 14c, 15c). Herein, each of the first field-effect transistors 13a, 14a, and 15a and second field-effect transistors 13b, 14b, and 15b of the input circuits 13 to 15 is constituted by an N-channel field-effect transistor (such as an N-channel MOSFET). It is preferable that the first field-effect transistors 13a, 14a, and 15a and the second field-effect transistors 13b, 14b, and 15b be constituted by field-effect transistors which are practically the same in size as one another. Sources of the first field-effect transistors 13a, 14a, and 15a of the input circuits 13 to 15 are connected to the inverting input terminal of the differential amplifier 1 and the first current source 6. Herein, the first current source 6 is connected to the ground terminal (grounded) and supplies the constant current. Moreover, each of drains of the first field-effect transistors 13a, 14a, and 15a of the input circuits 13 to 15 is connected to the positive supply Vdd via a current-voltage conversion element 31 (see FIG. 4) of the below-described back gate potential control circuit (13c, 14c, 15c). Then, the inverting input signals IN-1 to IN-3 are respectively input to gates of the first field-effect transistors 13a, 14a, and 15a of the corresponding input circuits 13 to 15.

Meanwhile, sources of the second field-effect transistors 13b, 14b, and 15b of the input circuits 13 to 15 are connected to the non-inverting input terminal of the differential amplifier 1 and the second current source 7. Herein, the second current source 7 is connected to the ground terminal (grounded) and supplies the constant current. Moreover, drains of the second field-effect transistors 13b, 14b, and 15b of the input circuits 13 to 15 are connected to the positive supply Vdd. Then, one non-inverting input signal IN+ is input to each of gates of the second field-effect transistors 13b, 14b, and 15b of the input circuits 13 to 15.

Each of the back gate potential control circuits 13c, 14c, and 15c is configured to generate the control voltage corresponding to the drain current of the first field-effect transistor (13a, 14a, 15a) of the corresponding input circuit (13, 14, 15) and apply the generated control voltage to the back gate of the first field-effect transistor (13a, 14a, 15a) of the corresponding input circuit (13, 14, 15) and the back gate of the second field-effect transistor (13b, 14b, 15b) of the corresponding input circuit (13, 14, 15). Specifically, each of the back gate potential control circuits 13c, 14c, and 15c is configured to generate such a control voltage that the internal impedance of the first field-effect transistor (13a, 14a, 15a) and the internal impedance of the second field-effect transistor (13b, 14b, 15b) decrease if the drain current of the first field-effect transistor (13a, 14a, 15a) increases, and the internal impedance of the first field-effect transistor (13a, 14a, 15a) and the internal impedance of the second field-effect transistor (13b, 14b, 15b) increase if the drain current of the first field-effect transistor (13a, 14a, 15a) decreases.

Figure 4:
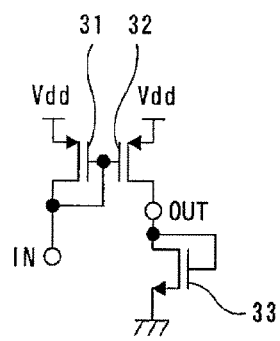
FIG. 4 is a circuit diagram showing a configuration example of the back gate potential control circuit in the multi-input differential amplifier of FIG. 3.

FIG. 4 is a circuit diagram showing a configuration example of the back gate potential control circuit in the multi-input differential amplifier of FIG. 3.

As shown in FIG. 4, each of the back gate potential control circuits 13c, 14c, and 15c includes the current-voltage conversion element 31 connected to the drain of the first field-effect transistor (13a, 14a, 15a) of the corresponding input circuit (13, 14, 15). For example, the current-voltage conversion element 31 is constituted by a diode-connected P-channel field-effect transistor (such as a P-channel MOSFET). A drain of the current-voltage conversion element 31 is connected to the drain of the first field-effect transistor (13a, 14a, 15a) of the corresponding input circuit (13, 14, 15) (the connection point is shown by IN in FIG. 4), and a source of the current-voltage conversion element 31 is connected to the positive supply Vdd. Moreover, a gate of the current-voltage conversion element 31 is connected to the drain thereof and a gate of a voltage-current conversion element 32. For example, the voltage-current conversion element 32 is constituted by a P-channel field-effect transistor (such as a P-channel MOSFET). It is preferable that the current-voltage conversion element 31 and the voltage-current conversion element 32 be constituted by field-effect transistors which are the same in size as each other. A source of the voltage-current conversion element 32 is connected to the positive supply Vdd, and a drain of the voltage-current conversion element 32 is connected to the ground terminal via a current-voltage conversion element 33. For example, the current-voltage conversion element 33 is constituted by a diode-connected N-channel field-effect transistor (such as an N-channel MOSFET). A drain of the current-voltage conversion element 33 is connected to a gate thereof and the drain of the voltage-current conversion element 32, and a source of the current-voltage conversion element 33 is connected to the ground terminal. Then, a voltage of a connection point OUT where the drain of the voltage-current conversion element 32 and the drain of the current-voltage conversion element 33 are connected to each other is applied as the control voltage to the back gate of the first field-effect transistor (13a, 14a, 15a) of the corresponding input circuit (13, 14, 15) and the back gate of the second field-effect transistor (13b, 14b, 15b) of the corresponding input circuit (13, 14, 15) (see FIG. 3). The current-voltage conversion element 33 may be constituted by a resistive element.

In summary, the first field-effect transistors 13a, 14a, and 15a for amplifying the inverting input signals in the plurality of (herein, three) input circuits 13 to 15 are arranged between the first current source 6 connected to the ground terminal and the positive supply Vdd so as to be connected to one another in parallel. Then, a connection point where the first current source 6 and the sources of the first field-effect transistors 13a, 14a, and 15a are connected to one another is connected to the inverting input terminal of the differential amplifier 1. Moreover, the second field-effect transistors 13b, 14b, and 15b for amplifying the non-inverting input signals in the plurality of input circuits 13 to 15 are arranged between the second current source 7 connected to the ground terminal and the positive supply Vdd so as to be connected to one another in parallel. Then, a connection point where the second current source 7 and the sources of the second field-effect transistors 13b, 14b, and 15b are connected to one another is connected to the non-inverting input terminal of the differential amplifier 1. Then, in each of the input circuit 13 to 15, the corresponding inverting input signal (IN-1, IN-2, IN-3) is input to the gate of the first field-effect transistor (13a, 14a, 15a), and one non-inverting input signal IN+ is input to the gate of the second field-effect transistor (13b, 14b, 15b). Moreover, in each of the input circuits 13 to 15, the control voltage corresponding to the drain current of the first field-effect transistor (13a, 14a, 15a) is applied from the corresponding back gate potential control circuit (13c, 14c, 15c) to the back gate of the first field-effect transistor (13a, 14a, 15a) and the back gate of the second field-effect transistor (13b, 14b, 15b).

Operations

Next, the operations of the multi-input differential amplifier configured as above will be explained.

In FIGS. 3 and 4, when the plurality of inverting input signals IN-1 to IN-3 and one non-inverting input signal IN+ are input, in each of the input circuit 13 to 15, the drain current corresponding to the corresponding inverting input signal (IN-1, IN-2, IN-3) flows through the first field-effect transistor (13a, 14a, 15a), and the drain current corresponding to the non-inverting input signal IN+ flows through the second field-effect transistor (13b, 14b, 15b). More specifically, in each of the input circuits 13 to 15, the internal impedance of the first field-effect transistor (13a, 14a, 15a) becomes an impedance corresponding to the corresponding inverting input signal (IN-1, IN-2, IN-3), and the internal impedance of the second field-effect transistor (13b, 14b, 15b) becomes an impedance corresponding to the non-inverting input signal IN+. With this, the constant current supplied from the first current source 6 is divided in inverse proportion to the internal impedances of the first field-effect transistors 13a, 14a, and 15a to flow through the first field-effect transistors 13a, 14a, and 15a. As a result, the drain currents corresponding to the inverting input signals IN-1, IN-2, and IN-3 respectively flow through the first field-effect transistors 13a, 14a, and 15a. In this case, the highest is the drain current of the first field-effect transistor (13a, 14a, 15a) having the gate to which the inverting input signal (IN-1, IN-2, IN-3) having the highest (largest) voltage value among the inverting input signals IN-1 to IN-3 is input. Moreover, the constant current supplied from the second current source 7 is divided in inverse proportion to the internal impedances of the second field-effect transistors 13b, 14b, and 15b to flow through the second field-effect transistors 13b, 14b, and 15b. As a result, the drain current corresponding to the non-inverting input signal IN+ flows through each of the second field-effect transistors 13b, 14b, and 15b. In this case, the magnitudes of the drain currents of the second field-effect transistors 13b, 14b, and 15b are practically the same as one another.

The plurality of first field-effect transistors 13a, 14a, and 15a are connected to one another in parallel. Therefore, a voltage corresponding to the product of the internal impedance and drain current of the first field-effect transistor (13a, 14a, 15a) is generated at the connection point where the first current source 6 and the sources of the first field-effect transistors 13a, 14a, and 15a are connected to one another, and this voltage is common among the plurality of first field-effect transistors 13a, 14a, and 15a. This voltage is applied to the inverting input terminal of the differential amplifier 1. With this, the inverting input signals IN-1 to IN-3 are respectively selected by the first field-effect transistors 13a, 14a, and 15a and collectively applied to the inverting input terminal of the differential amplifier 1.

Moreover, the plurality of second field-effect transistors 13b, 14b, and 15b are connected to one another in parallel. Therefore, a voltage corresponding to the product of the internal impedance and drain current of the second field-effect transistor (13b, 14b, 15b) is generated at the connection point where the second current source 7 and the sources of the second field-effect transistors 13b, 14b, and 15b are connected to one another, and this voltage is common among the plurality of second field-effect transistors 13b, 14b, and 15b. This voltage is applied to the non-inverting input terminal of the differential amplifier 1. With this, one non-inverting input signal IN+ is selected by each of the plurality of second field-effect transistors 13b, 14b, and 15b and collectively applied to the non-inverting input terminal of the differential amplifier 1.

Meanwhile, in each of the back gate potential control circuits 13c, 14c, and 15c of the input circuits 13 to 15, a voltage corresponding to the drain current of the corresponding first field-effect transistor (13a, 14a, 15a) is generated at both ends of the current-voltage conversion element 31. This voltage is applied to the gate of the voltage-current conversion element 32. With this, a drain current corresponding to this voltage flows through the voltage-current conversion element 32, and a voltage corresponding to this drain current is generated at both ends of the current-voltage conversion element 33. With this, a voltage which increases as the drain current of the corresponding first field-effect transistor (13a, 14a, 15a) increases is generated at the connection point OUT where the voltage-current conversion element 32 and the current-voltage conversion element 33 are connected to each other. The voltage of the connection point OUT is applied as the control voltage to the back gate of the corresponding first field-effect transistor (13a, 14a, 15a) and the back gate of the corresponding second field-effect transistor (13b, 14b, 15b).

Then, a threshold voltage of each of the first field-effect transistors 13a, 14a, and 15a and the second field-effect transistors 13b, 14b, and 15b decreases, and the internal impedance thereof decreases.

With this, the drain current of the first field-effect transistor (13a, 14a, 15a) having the gate to which the inverting input signal (IN-1 to IN-3) having the highest voltage value is input among the plurality of first field-effect transistors 13a, 14a, and 15a increases, and this decreases the drain current of the other first field-effect transistor (13a, 14a, 15a). Then, the change in the drain current in the first field-effect transistor (13a, 14a, 15a) is fed back to the corresponding back gate potential control circuit (13c, 14c, 15c). Thus, the threshold voltage of the first field-effect transistor (13a, 14a, 15a) having the gate to which the inverting input signal (IN-1 to IN-3) having the highest voltage value is input decreases more, and the drain current thereof increases more. Moreover, the threshold voltage of the other first field-effect transistor (13a, 14a, 15a) increases more, and the drain current thereof decreases more. Then, finally, most (preferably all) of the current supplied from the first current source 6 flows as the drain current through the first field-effect transistor (13a, 14a, 15a) having the gate to which the inverting input signal (IN-1 to IN-3) having the highest voltage value is input. A voltage corresponding to the product of the internal impedance and drain current of the first field-effect transistor (13a, 14a, 15a) in this state is applied to the inverting input terminal of the differential amplifier 1.

With this, the inverting input signal (IN-1, IN-2, IN-3) having the highest voltage value among the plurality of inverting input signals IN-1 to IN-3 is preferentially selected to be applied to the inverting input terminal of the differential amplifier 1.

Meanwhile, when the internal impedance of the second field-effect transistor (13a, 14a, 15a) becomes low, the drain current of the second field-effect transistor (13b, 14b, 15b) of the input circuit (13 to 15) including the first field-effect transistor (13a, 14a, 15a) having the gate to which the inverting input signal (IN-1 to IN-3) having the highest voltage value is input increases, and this decreases the drain current of the other second field-effect transistor (13b, 14b, 15b). Then, finally, most (preferably all) of the constant current supplied from the second current source 7 flows as the drain current of the second field-effect transistor (13a, 14a, 15a) of the input circuit (13 to 15) including the first field-effect transistor (13a, 14a, 15a) having the gate to which the inverting input signal (IN-1 to IN-3) having the highest voltage value is input. A voltage corresponding to the product of the internal impedance and drain current of the second field-effect transistor (13b, 14b, 15b) in this state is applied to the non-inverting input terminal of the differential amplifier 1.

With this, the second field-effect transistor (13b, 14b, 15b) of the input circuit (13 to 15) corresponding to the inverting input signal (IN-1, IN-2, IN-3) having the highest voltage value is selected among the plurality of second field-effect transistors 13b, 14b, and 15b. Then, the non-inverting signal IN+ input to the gate of the selected second field-effect transistor (13b, 14b, 15b) is selected by the second field-effect transistor (13b, 14b, 15b) to be applied to the non-inverting input terminal of the differential amplifier 1.

In addition, in the same input circuit (13 to 15), the same control voltage is applied to the back gate of the first field-effect transistor (13a, 14a, 15a) and the back gate of the second field-effect transistor (13b, 14b, 15b). Therefore, the offset is prevented from being generated between the voltage input to the inverting input terminal of the differential amplifier 1 and the voltage input to the non-inverting input terminal of the differential amplifier 1 by the change in the threshold by the application of the control voltage to the back gates.

Here, since the above explained transient state elapses instantly, the final state actually appears. With this, the differential amplifier 1 amplifies the difference between the inverting input signal (IN-1, IN-2, IN-3) having the highest voltage value and the non-inverting signal IN+ to output the difference.

As explained above, the multi-input differential amplifier of the present embodiment can select a pair of one input signal (input signal having the highest voltage value) among the plurality of inverting input signals IN-1 to IN-3 and one non-inverting input signal IN+, and amplify and output the difference between these signals. In addition, the offset is prevented from being generated when selecting a pair of one of the inverting input signals IN-1 to IN-3 and one non-inverting input signal IN+.

Embodiment 3

Embodiment 3 of the present invention exemplifies a light emitting element driving device using the multi-input differential amplifier of Embodiment 1 as an application example of the multi-input differential amplifier.

Figure 5:
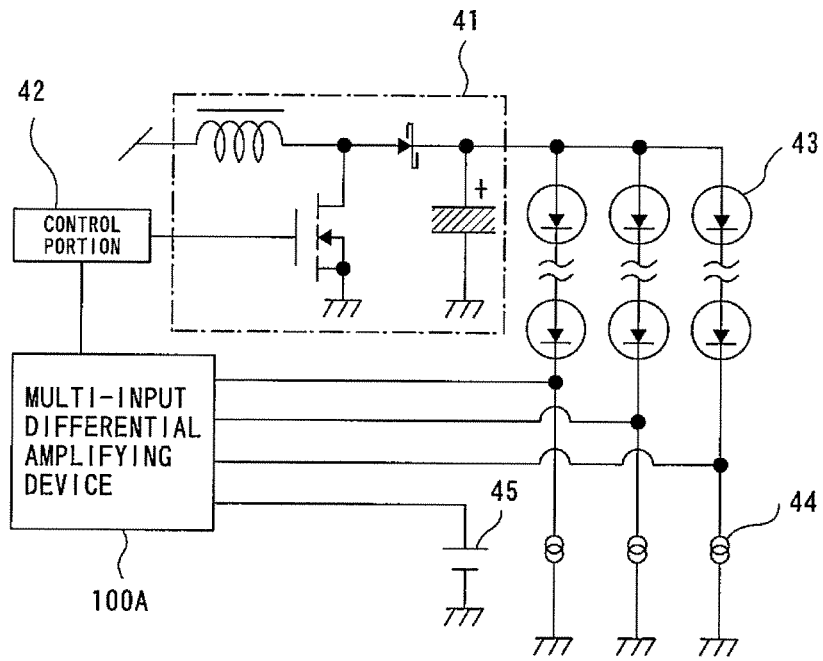
FIG. 5 is a circuit diagram showing the configuration of a light emitting element driving device according to Embodiment 3 of the present invention.
Figure 6:
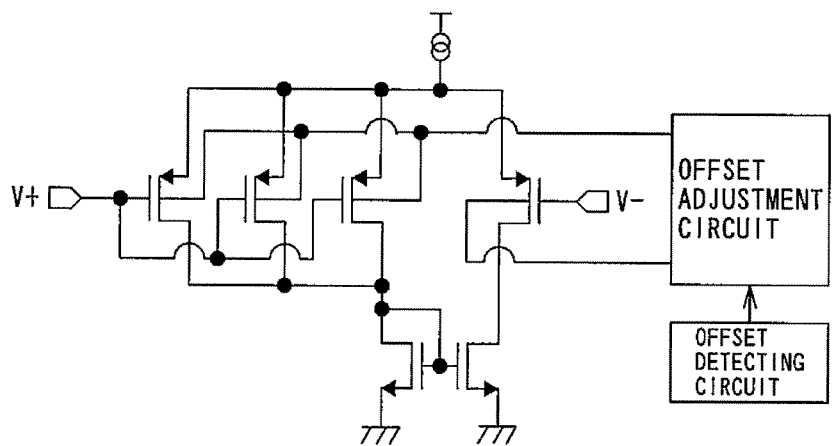
FIG. 6 is a circuit diagram showing the configuration of a conventional differential amplifier.

FIG. 5 is a circuit diagram showing the configuration of the light emitting element driving device according to Embodiment 3 of the present invention.

As shown in FIG. 5, the light emitting element driving device of the present embodiment includes a power supply portion 41, a control portion 42, and the multi-input differential amplifier 100A of Embodiment 1.

For example, the power supply portion 41 is constituted by a known boost chopper. The power supply portion 41 applies a power supply voltage to a plurality (herein, three) current paths, on each of which LEDs (light-emitting diodes) 43 as a plurality of light emitting elements and a driver (constant current source) 44 configured to supply a predetermined constant current to the plurality of LEDs 43 are connected in series.

As shown in FIGS. 1 and 5, in the multi-input differential amplifier 100A, the voltages applied to the drivers 44 on the plurality of current paths are input to the input portion 2 as the plurality of inverting input signals (first input signals) IN-1 to IN-3, and a reference voltage of a reference voltage power supply 45 is input to the input portion 2 as the non-inverting input signal (second input signal). The reference voltage is suitably set such that transistors constituting the drivers 44 can operated in an active area. Then, the differential amplifier 1 of the multi-input differential amplifier 100A amplifies a difference between the reference voltage and a lowest one of the voltages applied to the drivers 44 on the plurality of current paths to output the difference. This difference is input to the control portion 42.

To reduce the difference input from the multi-input differential amplifier 100A, the control portion 42 carries out feedback control of the power supply voltage output from the power supply portion 41.

With this, the power supply voltage output from the power supply portion 41 is controlled such that the lowest one of the voltages applied to the drivers 44 on the plurality of current paths becomes the reference voltage. As a result, the transistors constituting the drivers 44 operate in the active area at all times, and the predetermined constant current is supplied to the plurality of LEDs on the plurality of current paths. On this account, a large number of LEDs can stably emit light.

Other Embodiment

Each of the multi-input differential amplifiers 100A and 100B of Embodiments 1 and 2 can be used as a multi-input differential amplifier if, for example, the differential amplifier 1 is constituted by a differential amplifier having a predetermined amplification factor. Moreover, each of the multi-input differential amplifiers 100A and 100B of Embodiments 1 and 2 can be used as a multi-input comparator if, for example, the differential amplifier 1 is constituted by an operational amplifier.

In the foregoing, the ground terminal is exemplified as a low-voltage side power supply. However, the low-voltage side power supply is not limited to this and may be anything as long as it applies a voltage (potential) lower than the positive supply Vdd.

Moreover, the foregoing has explained a case where the number of inverting input signals is plural and the number of non-inverting input signals is one. However, there may be a case where the number of non-inverting input signals is plural and the number of inverting input signals is one. In this case, for example, in FIGS. 1 and 3, the sources of the plurality of first field-effect transistors (3a, and the like) may be connected to the non-inverting input terminal of the differential amplifier 1, and the sources of the plurality of second field-effect transistors (3b, and the like) may be connected to the inverting input terminal of the differential amplifier 1.

Moreover, in the foregoing, the plurality of first field-effect transistors (3a, and the like) are connected to the constant current source 6 in parallel, and the plurality of second field-effect transistors (3b, and the like) are connected to the constant current source 7 in parallel. However, instead of the constant current sources 6 and 7, a circuit element, such as a resistive element having a constant resistance (impedance), may be used.

From the foregoing explanation, many modifications and other embodiments of the present invention are obvious to one skilled in the art. Therefore, the foregoing explanation should be interpreted only as an example and is provided for the purpose of teaching the best mode for carrying out the present invention to one skilled in the art. The structures and/or functional details may be substantially modified within the spirit of the present invention.

The multi-input differential amplifier according to the present invention is useful as, for example, a differential amplifier configured to, when one of the number of inverting input signals and the number of non-inverting input signals is plural, preferably select one of the plurality of input signals and amplify a difference between the selected signal and the other one of the inverting input signal and the non-inverting input signal.

Moreover, the light emitting element driving device according to the present invention is useful as, for example, a light emitting element driving device capable of stably causing a large number of light emitting elements to emit light.

What is claimed is:

1. A multi-input differential amplifying device, comprising:
a differential amplifier including an inverting input terminal and a non-inverting input terminal; and
an input portion configured to apply a first input voltage to a first input terminal which is one of the inverting input terminal and the non-inverting input terminal and apply a second input voltage to a second input terminal which is the other one of the inverting input terminal and the non-inverting input terminal, the first input voltage corresponding to first input signals including a plurality of input signals for the first input terminal, the second input voltage corresponding to a second input signal which is one input signal for the second input terminal, wherein:

the input portion is configured to correct an offset voltage between the first input voltage and the second input voltage, the input portion comprises a plurality of input circuits corresponding to the plurality of first input signals, and each of the input circuits comprises:
 a first field-effect transistor having a source connected to the first input terminal and a gate to which a corresponding one of the first input signals is input;
 a second field-effect transistor having a source connected to the second input terminal and a gate to which the second input signal is input; and
 a back gate potential control circuit configured to generate a control voltage corresponding to a drain current of the first field-effect transistor and apply the generated control voltage to a back gate of the first field-effect transistor and a back gate of the second field-effect transistor.

2. The multi-input differential amplifying device according to claim 1, wherein the first field-effect transistor and the second field-effect transistor are P-channel field-effect transistors.

3. The multi-input differential amplifying device according to claim 1, wherein the first field-effect transistor and the second field-effect transistor are N-channel field-effect transistors.

4. The multi-input differential amplifying device according to claim 1, wherein the back gate potential control circuit is configured to generate such a control voltage that:
 if the drain current of the first field-effect transistor increases, an impedance between a drain and the source of each of the first field-effect transistor and the second field-effect transistor decreases; and
 if the drain current of the first field-effect transistor decreases, the impedance between the drain and the source of each of the first field-effect transistor and the second field-effect transistor increases.

5. The multi-input differential amplifying device according to claim 4, wherein the first field-effect transistor and the second field-effect transistor are P-channel field-effect transistors.

6. The multi-input differential amplifying device according to claim 4, wherein the first field-effect transistor and the second field-effect transistor are N-channel field-effect transistors.

7. A light emitting element driving device comprising:
 a power supply portion configured to apply a power supply voltage to a plurality of current paths, on each of which a plurality of light emitting elements and a driver configured to supply a current to the plurality of light emitting elements are connected in series;
 a multi-input differential amplifying device including:
  a differential amplifier including an inverting input terminal and a non-inverting input terminal; and
  an input portion configured to apply a first input voltage to a first input terminal which is one of the inverting input terminal and the non-inverting input terminal and apply a second input voltage to a second input terminal which is the other one of the inverting input terminal and the non-inverting input terminal, the first input voltage corresponding to first input signals including a plurality of input signals for the first input terminal, the second input voltage corresponding to a second input signal which is one input signal for the second input terminal; and
 a control portion configured to carry out feedback control of a power supply voltage applied by the power supply based on an output of the differential amplifier of the multi-input differential amplifying device, wherein:
 voltages applied to the drivers on the plurality of current paths are input to the input portion as the plurality of first input signals,
 a reference voltage is input to the input portion as the second input signal, and
 the differential amplifier is configured to amplify a difference between the reference voltage and one of the voltages applied to the drivers on the plurality of current paths to output the difference.

8. A differential amplifying device configured to correct an offset voltage between a first input signal and a second input signal, the differential amplifying device comprising:
 a first input terminal to which the first input signal is applied;
 a second input terminal to which the second input signal is applied;
 a differential amplifier circuit including a pair of input terminals;
 a first field-effect transistor having a gate to which the first input terminal is connected and a source to which one of the pair of input terminals of the differential amplifier circuit is connected;
 a second field-effect transistor having a gate to which the second input terminal is connected and a source to which the other one of the pair of input terminals of the differential amplifier circuit is connected; and
 a back gate potential control circuit configured to generate a control voltage corresponding to a drain current of the first field-effect transistor and apply the generated control voltage to a back gate of the first field-effect transistor and a back gate of the second field-effect transistor.

9. The differential amplifying device according to claim 8, wherein the back gate potential control circuit is configured to generate such a control voltage that:
 if the drain current of the first field-effect transistor increases, an impedance between a drain and the source of each of the first field-effect transistor and the second field-effect transistor decreases; and
 if the drain current of the first field-effect transistor decreases, the impedance between the drain and the source of each of the first field-effect transistor and the second field-effect transistor increases.

10. The differential amplifying device according to claim 8, wherein:
 the back gate potential control circuit includes third and fourth field-effect transistors each having a polarity opposite to a polarity of the first field-effect transistor, and includes a fifth field-effect transistor having a same polarity as the first field-effect transistor,
 gates of the third and fourth field-effect transistors and a drain of the third field-effect transistor are connected to a drain of the first field-effect transistor;
 a drain and a gate of the fifth field-effect transistor are connected to a drain of the fourth field-effect transistor,
 a first fixed voltage is applied to each of sources of the third and fourth field-effect transistors,
 a second fixed voltage is applied to a source of the fifth field-effect transistor, and
 a voltage of a connection portion of the fourth and fifth field-effect transistors is applied to each of the back gates of the first and second field-effect transistors.

11. The differential amplifying device according to claim 8, further comprising:
 a third input terminal to which a third input signal is applied;

a sixth field-effect transistor having a gate to which the third input terminal is connected and a source to which one of the pair of input terminals of the differential amplifier circuit is connected;

a seventh field-effect transistor having a gate to which the second input terminal is connected and a source to which the other one of the pair of input terminals of the differential amplifier circuit is connected; and a second back gate potential control circuit configured to generate a control voltage corresponding to a drain current of the sixth field-effect transistor and apply the generated control voltage to a back gate of the sixth field-effect transistor and a back gate of the seventh field-effect transistor.

12. The differential amplifying device according to claim 11, wherein:

the second back gate potential control circuit includes eighth and ninth field-effect transistors each having a polarity opposite to a polarity of the sixth field-effect transistor, and includes a tenth field-effect transistor having a same polarity as the first field-effect transistor, gates of the eighth and ninth field-effect transistors and a drain of the eighth field-effect transistor are connected to a drain of the sixth field-effect transistor, a drain and a gate of the tenth field-effect transistor are connected to a drain of the ninth field-effect transistor, a first fixed voltage is applied to each of sources of the eighth and ninth field-effect transistors, a second fixed voltage is applied to a source of the tenth field-effect transistor, and a voltage of a connection portion of the ninth and tenth field-effect transistors is applied to each of the back gates of the sixth and seventh field-effect transistors.

\* \* \* \* \*